(12) United States Patent
Kondo et al.

(10) Patent No.: US 10,957,617 B2
(45) Date of Patent: Mar. 23, 2021

(54) SEMICONDUCTOR DEVICE

(71) Applicant: Murata Manufacturing Co., Ltd., Kyoto-fu (JP)

(72) Inventors: Masao Kondo, Nagaokakyo (JP); Isao Obu, Nagaokakyo (JP); Yasunari Umemoto, Nagaokakyo (JP); Yasuhisa Yamamoto, Nagaokakyo (JP); Masahiro Shibata, Nagaokakyo (JP); Takayuki Tsutsui, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/374,674

(22) Filed: Apr. 3, 2019

(65) Prior Publication Data
US 2019/0326191 A1  Oct. 24, 2019

(30) Foreign Application Priority Data
Apr. 23, 2018  (JP) .............................. JP2018-082156

(51) Int. Cl.
*H01L 23/367* (2006.01)
*H01L 23/498* (2006.01)
(Continued)

(52) U.S. Cl.
CPC ........ *H01L 23/367* (2013.01); *H01L 23/3121* (2013.01); *H01L 23/3135* (2013.01);
(Continued)

(58) Field of Classification Search
CPC ............... H01L 23/367; H01L 23/3121; H01L 23/3135; H01L 23/481; H01L 23/49811;
(Continued)

(56) References Cited

U.S. PATENT DOCUMENTS

| 2010/0109052 A1* | 5/2010 | Nakajima | ............... | H01L 24/73 257/197 |
| 2010/0123225 A1* | 5/2010 | Gruenhagen | ....... | H01L 23/3114 257/666 |
| 2012/0056337 A1* | 3/2012 | Shiroki | ............ | G06K 19/07754 257/782 |

FOREIGN PATENT DOCUMENTS

| JP | H06-005620 A | 1/1994 |
| JP | 2011-198866 A | 10/2011 |

(Continued)

*Primary Examiner* — Tong-Ho Kim
(74) *Attorney, Agent, or Firm* — Studebaker & Brackett PC

(57) ABSTRACT

A semiconductor chip includes an active element on a first surface of a substrate. A heat-conductive film having a higher thermal conductivity than the substrate is disposed at a position different from a position of the active element. An insulating film covering the active element and heat-conductive film is disposed on the first surface. A bump electrically connected to the heat-conductive film is disposed on the insulating film. A via-hole extends from a second surface opposite to the first surface to the heat-conductive film. A heat-conductive member having a higher thermal conductivity than the substrate is continuously disposed from a region of the second surface overlapping the active element in plan view to an inner surface of the via-hole. The bump is connected to a land of a printed circuit board facing the first surface. The semiconductor chip is sealed with a resin.

22 Claims, 9 Drawing Sheets

(51) Int. Cl.
*H01L 23/31* (2006.01)
*H01L 23/00* (2006.01)
*H01L 23/48* (2006.01)
*H03F 1/30* (2006.01)
*H03F 3/68* (2006.01)

(52) U.S. Cl.
CPC ...... *H01L 23/481* (2013.01); *H01L 23/49811* (2013.01); *H01L 23/49822* (2013.01); *H01L 24/16* (2013.01); *H03F 1/302* (2013.01); *H01L 24/05* (2013.01); *H01L 24/13* (2013.01); *H01L 2224/05025* (2013.01); *H01L 2224/13147* (2013.01); *H01L 2224/16227* (2013.01); *H01L 2924/10329* (2013.01); *H01L 2924/13051* (2013.01); *H01L 2924/30111* (2013.01); *H03F 3/68* (2013.01); *H03F 2200/222* (2013.01); *H03F 2200/318* (2013.01); *H03F 2200/387* (2013.01)

(58) Field of Classification Search
CPC ... H01L 23/49822; H01L 24/16; H01L 24/13; H01L 24/05; H01L 2224/05025; H01L 2224/13147; H01L 2224/16227; H01L 2924/10329; H01L 2924/13051; H01L 2924/30111; H03F 1/302; H03F 3/68; H03F 2200/222; H03F 2200/318; H03F 2200/387
USPC ........................................................ 257/737
See application file for complete search history.

(56) References Cited

FOREIGN PATENT DOCUMENTS

JP          2014-099470 A     5/2014
WO          2007/138771 A1    12/2007

* cited by examiner

SEMICONDUCTOR DEVICE

CROSS-REFERENCE TO RELATED APPLICATION

This application claims benefit of priority to Japanese Patent Application No. 2018-082156, filed Apr. 23, 2018, the entire content of which is incorporated herein by reference.

BACKGROUND

Technical Field

The present disclosure relates to a semiconductor device.

Background Art

During the operation of a power amplifier incorporated in a semiconductor chip, self-heating occurs in transistors, and the performance of the semiconductor chip may decrease with an increase in the operating temperature of the transistors. In order to suppress the deterioration of the semiconductor chip, it is desirable to efficiently dissipate heat from the transistors, which are a heat-generating source, to the outside of the semiconductor chip.

Japanese Unexamined Patent Application Publication No. 2011-198866 discloses a heat transfer path from a semiconductor chip mounted on a module substrate. In the disclosure described in Japanese Unexamined Patent Application Publication No. 2011-198866, a heat transfer path is formed from a bump of a semiconductor chip through a terminal formed on an upper surface of a module substrate and a heat dissipation via extending from the upper surface to a lower surface of the module substrate to an electrode for grounding, the electrode being formed on the lower surface of the module substrate.

An emitter or a source of a transistor is connected to the electrode for grounding. Accordingly, the emitter or the source is included in a portion of the heat transfer path. The emitter or the source connected to the bump and functioning as the heat transfer path usually has a small area, and a portion of the heat transfer path, the portion being connected to the emitter or the source, becomes a bottleneck. Therefore, it is difficult to sufficiently reduce thermal resistance of the heat transfer path.

Japanese Unexamined Patent Application Publication No. 2014-99470 discloses a semiconductor device having improved heat dissipation characteristics. The semiconductor device disclosed in Japanese Unexamined Patent Application Publication No. 2014-99470 includes a heat dissipation structure extending from an external connection pad to an upper surface of a semiconductor substrate having an active element. Heat generated in a transistor formed on the upper surface of the semiconductor substrate is transferred in the lateral direction along the upper surface of the semiconductor substrate to the position at which the heat dissipation structure is disposed and then dissipated through the heat dissipation structure.

SUMMARY

Heat generated in a heat-generating source such as a transistor is transferred through a semiconductor substrate not only in the lateral direction along the upper surface of the semiconductor substrate but also in the thickness direction of the semiconductor substrate. In existing semiconductor devices, it is difficult to efficiently dissipate, to the outside, heat that is generated in a heat-generating source on a surface of a semiconductor substrate and that diffuses inside the semiconductor substrate.

Accordingly, the present disclosure provides a semiconductor device in which heat diffusing inside a substrate can be efficiently dissipated to the outside.

According to an aspect of the present disclosure, there is provided a semiconductor device including a printed circuit board having a land on a mounting surface of the printed circuit board and a semiconductor chip mounted on the printed circuit board. The semiconductor chip includes an active element formed on a first surface of a substrate. The first surface faces the printed circuit board. The semiconductor chip further includes a heat-conductive film that is disposed on the first surface of the substrate at a position different from a position of the active element and that is made of a material having a higher thermal conductivity than the substrate, an insulating film that is disposed on the first surface of the substrate and that covers the active element and the heat-conductive film, a bump that is disposed on the insulating film and that is electrically connected to the heat-conductive film, a through via-hole extending from a second surface opposite the first surface of the substrate to the heat-conductive film, and a heat-conductive member that is continuously disposed from a region of the second surface. The region overlaps the active element in plan view, to an inner surface of the through via-hole and that is made of a material having a higher thermal conductivity than the substrate. The bump is connected to the land, and the semiconductor chip is sealed with a sealing resin.

According to another aspect of the present disclosure, there is provided a semiconductor device including an active element formed on a first surface of a substrate; a heat-conductive film that is disposed on the first surface of the substrate at a position different from a position of the active element and that is made of a material having a higher thermal conductivity than the substrate; an insulating film that is disposed on the first surface of the substrate and that covers the active element and the heat-conductive film; a bump that is disposed on the insulating film and that is electrically connected to the heat-conductive film; a recess that is formed in a second surface of the substrate, the second surface being opposite the first surface, and that at least partially overlaps the active element and the heat-conductive film in plan view; and a heat-conductive member that is disposed on an inner surface of the recess and that is made of a material having a higher thermal conductivity than the substrate. The heat-conductive member disposed on a bottom surface of the recess and the heat-conductive film face each other with a part of the substrate therebetween.

Heat that is generated in the active element and that diffuses to the substrate side is dissipated to the outside through the heat-conductive member, the heat-conductive film, and the bump. Therefore, the heat that diffuses inside the substrate can be efficiently dissipated to the outside.

Other features, elements, characteristics and advantages of the present disclosure will become more apparent from the following detailed description of preferred embodiments of the present disclosure with reference to the attached drawings.

DETAILED DESCRIPTION

First Embodiment

A semiconductor device according to a first embodiment will be described with reference to FIGS. 1A to 3.

Figure 1A:
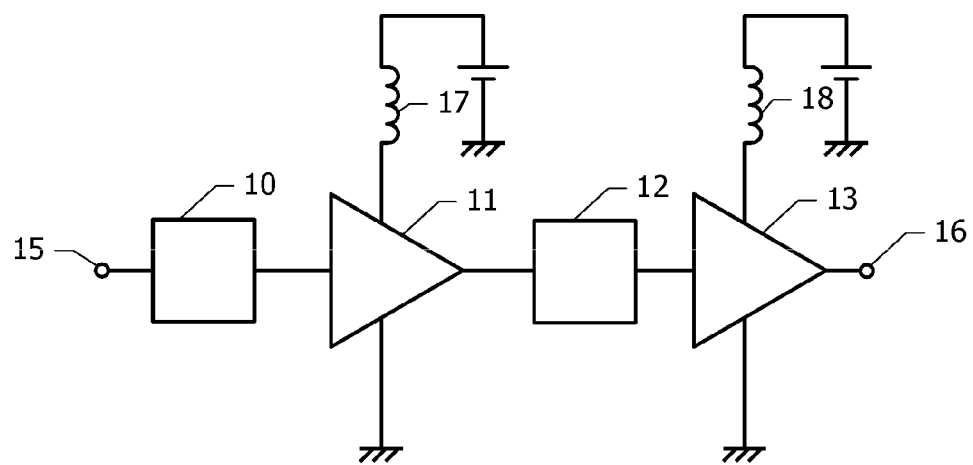
FIG. 1A is a block diagram of a semiconductor device according to a first embodiment.

FIG. 1A is a block diagram of a semiconductor device according to the first embodiment. An input signal is input from an input terminal 15 to a driver-stage amplifier circuit 11 through an impedance-matching circuit 10. The signal amplified in the driver-stage amplifier circuit 11 is input to an output-stage amplifier circuit 13 through an impedance-matching circuit 12. The signal amplified in the output-stage amplifier circuit 13 is output from an output terminal 16. Direct-current power is supplied to the driver-stage amplifier circuit 11 through an inductor 17. Direct-current power is supplied to the output-stage amplifier circuit 13 through an inductor 18.

Figure 1B:
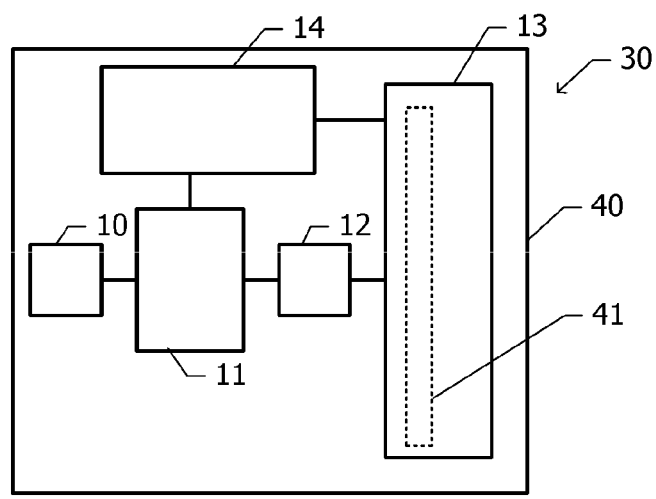
FIG. 1B is a plan view illustrating a layout of circuits of a semiconductor device according to the first embodiment.

FIG. 1B is a plan view illustrating a layout of circuits of a semiconductor chip 30 included in a semiconductor device according to the first embodiment. Impedance-matching circuits 10 and 12, a driver-stage amplifier circuit 11, an output-stage amplifier circuit 13, and a control circuit 14 are formed on a surface of a semiconductor substrate 40. A through via-hole 41 that penetrates the semiconductor substrate 40 in a thickness direction is formed in a region where the output-stage amplifier circuit 13 is formed.

The through via-hole 41 has a function of efficiently conducting heat generated in transistors included in the output-stage amplifier circuit 13 to the outside of the semiconductor chip 30 as described below. The amount of heat generated in transistors of the driver-stage amplifier circuit 11 is smaller than the amount of heat generated in transistors of the output-stage amplifier circuit 13. Therefore, the through via-hole 41 is preferably formed so as to correspond to the output-stage amplifier circuit 13. The formation of a through via-hole for the driver-stage amplifier circuit 11 is optional.

Figure 1C:
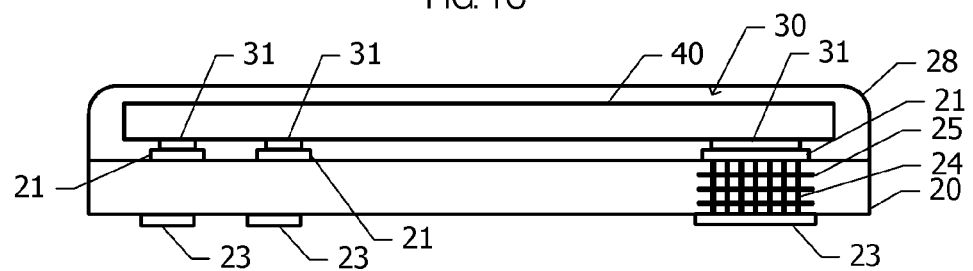
FIG. 1C is a schematic sectional view of a semiconductor device according to the first embodiment.

FIG. 1C is a schematic sectional view of a semiconductor device according to the first embodiment. A semiconductor chip 30 is mounted on a mounting surface (the upper surface in FIG. 1C) of a printed circuit board 20. The semiconductor chip 30 includes a plurality of bumps 31 formed on a surface (hereinafter, referred to as a "first surface") of a semiconductor substrate 40, the surface facing the printed circuit board 20. The printed circuit board 20 includes a plurality of lands 21 formed on the mounting surface and a plurality of electrodes 23 for external connection, the electrodes 23 being formed on the lower surface (the surface opposite the mounting surface).

Among the lands 21, at least one of the lands 21 is a land 21 for grounding. Among the electrodes 23, at least one of the electrodes 23 is an electrode 23 for grounding. The land 21 for grounding and the electrode 23 for grounding are electrically connected to each other with a plurality of via conductors 24 and a plurality of inner-layer wiring lines 25 therebetween.

The bumps 31 of the semiconductor chip 30 are connected to the lands 21 of the printed circuit board 20. Among the bumps 31 of the semiconductor chip 30, at least one of the bumps 31 is a bump 31 for grounding. The bump 31 for grounding is connected to the land 21 for grounding of the printed circuit board 20. The semiconductor chip 30 is sealed with a sealing resin 28.

Figure 2A:
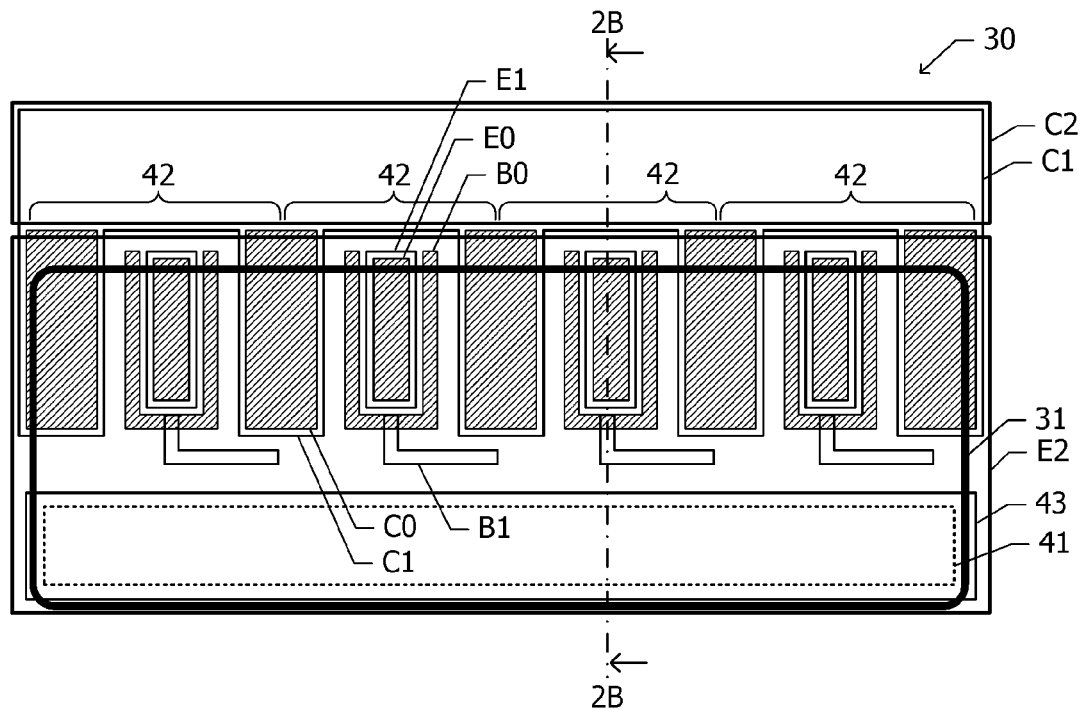
FIG. 2A is a plan view of an output-stage amplifier circuit formed on a semiconductor chip included in a semiconductor device according to the first embodiment.

FIG. 2A is a plan view of an output-stage amplifier circuit 13 (FIG. 1A) formed on a semiconductor chip 30 included in a semiconductor device according to the first embodiment. The output-stage amplifier circuit 13 includes, for example, four transistors 42 (active elements) that are connected in parallel to each other and that are arranged in a line. Hereinafter, a direction in which the transistors 42 are arranged is simply referred to as an "arrangement direction". The transistors 42 are, for example, heterojunction bipolar transistors.

The transistors 42 each include an emitter electrode E0, a base electrode B0, and a collector electrode C0. Regions of the emitter electrodes E0, the base electrodes B0, and the collector electrodes C0 are hatched in FIG. 2A. When attention is focused on one transistor 42, a portion of a base electrode B0 is disposed on both sides of an emitter electrode E0 with respect to the arrangement direction, and collector electrodes C0 are disposed on both sides of the portions of the base electrode B0. The portions of the base electrode B0 disposed on both sides of the emitter electrode E0 are continuous with each other outside the emitter electrode E0. For example, the base electrode B0 surrounds the emitter electrode E0 so as to form a U-shape from three directions in plan view. Transistors 42 adjacent to each other share one collector electrode C0.

A plurality of first-layer emitter wiring lines E1 are disposed so as to overlap a plurality of emitter electrodes E0. A plurality of first-layer base wiring lines B1 overlap portions of a plurality of base electrodes B0 and extend from the overlapping portions to the outside. A first-layer collector wiring line C1 includes a linear portion and a plurality of comb-tooth portions. The comb-tooth portions of the first-layer collector wiring line C1 overlap a plurality of collector electrodes C0. The linear portion of the first-layer collector wiring line C1 is adjacent to the collector electrodes C0, extends from a position at which a transistor 42 at one end is disposed to a position at which a transistor 42 at the other end is disposed with respect to the arrangement direction, and is connected to each of the plurality of comb-tooth portions.

A heat-conductive film 43 is disposed at a position different from the positions of the transistors 42. For example, the heat-conductive film 43 is disposed on the side opposite to the linear portion of the first-layer collector wiring line C1 as viewed from the transistors 42. The heat-conductive film 43 has a shape that is long in the arrangement direction and extends from a position at which the transistor 42 at the one end is disposed to a position at which the transistor 42 at the other end is disposed with respect to the arrangement direction. The heat-conductive film 43 is formed of the same metal material as the first-layer base wiring line B1, the emitter wiring line E1, and the collector wiring line C1, for example, Au and is deposited in the same step as the step of depositing the first-layer base wiring line B1, the emitter wiring line E1, and the collector wiring line C1. A through via-hole 41 is formed inside the heat-conductive film 43 in plan view.

A second-layer collector wiring line C2 is disposed so as to overlap the linear portion of the first-layer collector wiring line C1. A second-layer emitter wiring line E2 is disposed so as to overlap the first-layer emitter wiring line E1 and the heat-conductive film 43.

A bump 31 is disposed as the uppermost layer. In plan view, the bump 31 overlaps the second-layer emitter wiring line E2 and either partially overlaps the plurality of emitter electrodes E0 and the heat-conductive film 43 or entirely overlaps the plurality of emitter electrodes E0 and the heat-conductive film 43.

Figure 2B:
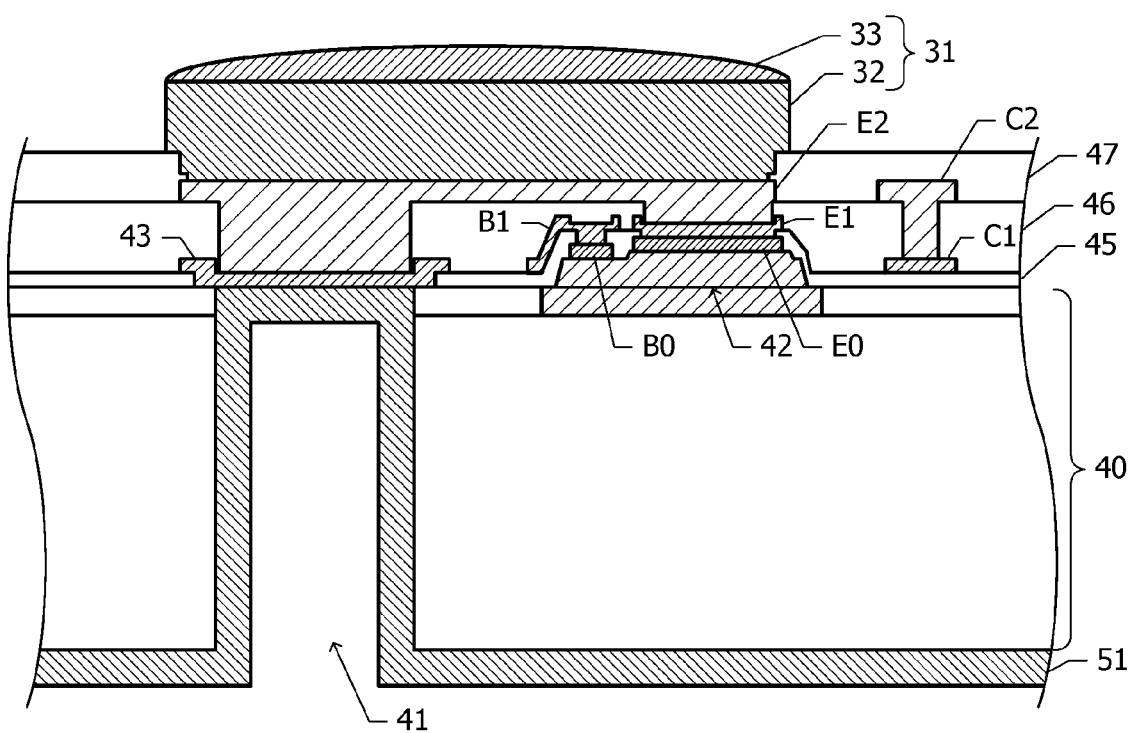
FIG. 2B is a sectional view taken along dash-dotted line 2B-2B in FIG. 2A.

FIG. 2B is a sectional view taken along dash-dotted line 2B-2B in FIG. 2A. A transistor 42 is formed on an upper surface (first surface) of a semiconductor substrate 40. The semiconductor substrate 40 includes, for example, a support substrate made of semi-insulating GaAs and an epitaxially grown layer made of GaAs that is epitaxially grown on the support substrate. In the epitaxially grown layer, the region where the transistor 42 is disposed is provided with a conductive property, and the other region has an insulating property.

The transistor 42 includes a semiconductor mesa that includes a collector layer, a base layer, and an emitter layer, a base electrode B0, and an emitter electrode E0. The collector electrodes C0 (FIG. 2A) do not appear on the section of FIG. 2B. An insulating film 45 made of, for example, SiN and covering the transistor 42 is disposed on an upper surface of the semiconductor substrate 40. A first-layer emitter wiring line E1, a first-layer base wiring line B1, a first-layer collector wiring line C1, and a heat-conductive film 43 are disposed on the insulating film 45. The first-layer emitter wiring line E1 and the first-layer base wiring line B1 are respectively connected to the emitter electrode E0 and the base electrode B0 through openings formed in the insulating film 45. In the section illustrated in FIG. 2B, no opening is formed in the insulating film 45 right under the first-layer collector wiring line C1. The heat-conductive film 43 contacts the upper surface of the semiconductor substrate 40 through an opening formed in the insulating film 45.

The first-layer emitter wiring line E1, base wiring line B1, and collector wiring line C1, and the heat-conductive film 43 are made of a metal such as Au. The thermal conductivity of the metal used as the heat-conductive film 43 is higher than the thermal conductivity of the semiconductor substrate 40.

An insulating film 46 is disposed on the insulating film 45 so as to cover the first-layer emitter wiring line E1, base wiring line B1, and collector wiring line C1, and the heat-conductive film 43. The insulating film 46 has a two-layer structure including, for example, a SiN film and a resin film, and the upper surface of the insulating film 46 is planarized.

A second-layer emitter wiring line E2 and a second-layer collector wiring line C2 are disposed on the insulating film 46. The second-layer emitter wiring line E2 is connected to the first-layer emitter wiring line E1 through an opening formed in the insulating film 46 and is also connected to the heat-conductive film 43 through another opening. The second-layer collector wiring line C2 is connected to the first-layer collector wiring line C1 through an opening formed in the insulating film 46.

An insulating film 47 is disposed on the insulating film 46. An opening that exposes a part of the second-layer emitter wiring line E2 is formed in the insulating film 47. A bump 31 is disposed on the second-layer emitter wiring line E2 in the opening and on a portion of the insulating film 47, the portion surrounding the opening. For example, a Cu pillar bump including a Cu pillar 32 and a solder bump 33 provided on the upper surface of the Cu pillar 32 is used as the bump 31. The bump 31 which is connected to the emitter electrode E0 with the emitter wiring lines E2 and E1 therebetween is a bump for grounding.

A through via-hole 41 extending from a lower surface (second surface) of the semiconductor substrate 40 to the heat-conductive film 43 is formed in the semiconductor substrate 40. A heat-conductive member 51 is continuously disposed from a region of the lower surface of the semiconductor substrate 40, the region overlapping the transistors 42 in plan view, to an inner surface of the through via-hole 41. For example, a metal film such as a Au film is used as the heat-conductive member 51. For example, the heat-conductive member 51 covers the entire region of the lower surface of the semiconductor substrate 40 and covers the entire region of the side surface and the bottom surface of the through via-hole 41. Since the heat-conductive film 43 is exposed at the bottom surface of the through via-hole 41, the heat-conductive member 51 contacts the heat-conductive film 43.

Next, advantageous effects of the first embodiment will be described with reference to FIG. 3.

Figure 3:
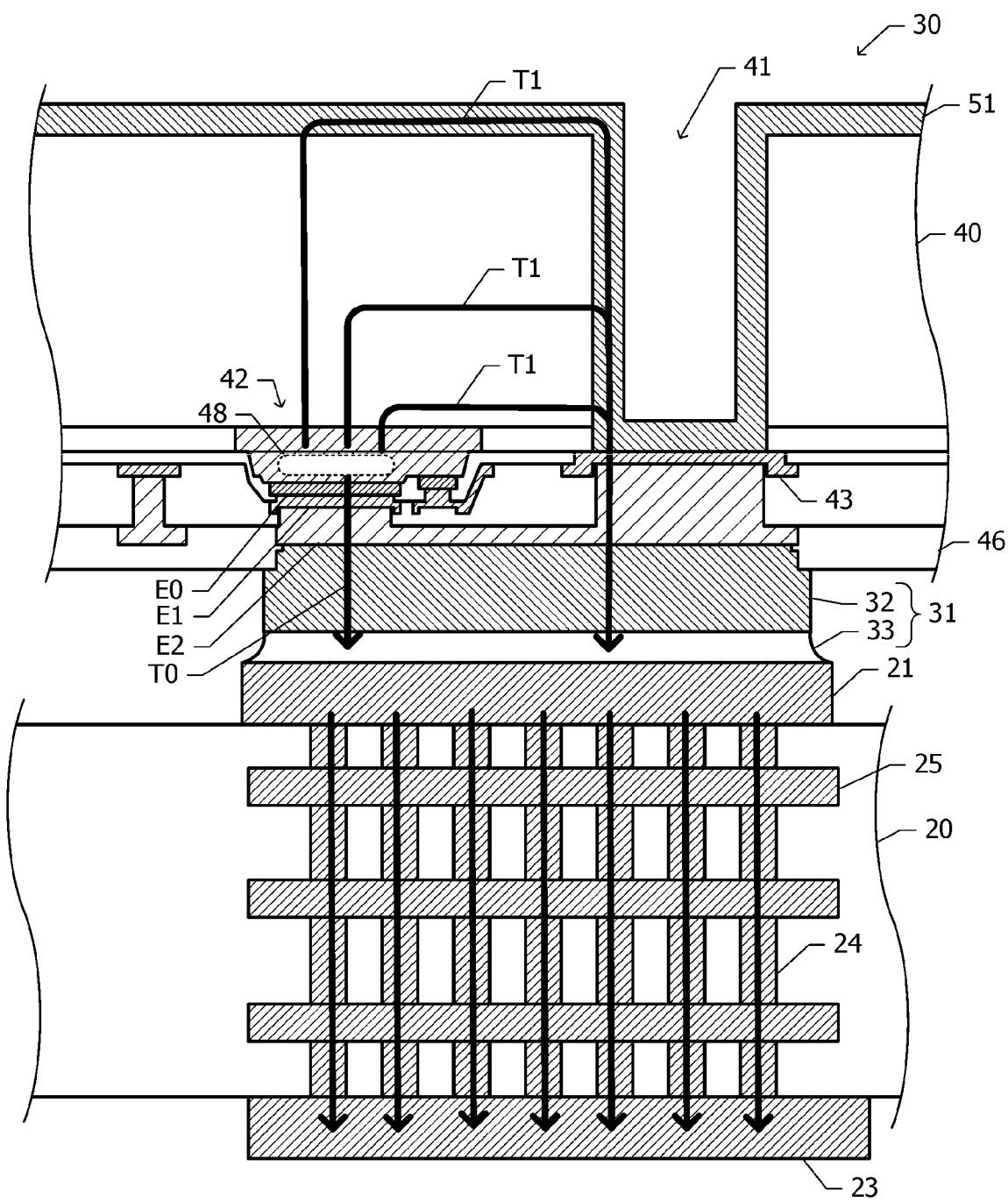
FIG. 3 is a sectional view near a bump of a semiconductor device according to the first embodiment.

FIG. 3 is a sectional view near a bump 31 of a semiconductor device according to the first embodiment. A bump 31 for grounding of a semiconductor chip 30 is electrically connected and mechanically fixed to a land 21 for grounding of a printed circuit board 20. The land 21 is connected to an electrode 23 for external connection, the electrode 23 being formed on a surface opposite a mounting surface, with a plurality of inner-layer wiring lines 25 and a plurality of via conductors 24 provided in the printed circuit board 20 therebetween.

During the operation of a transistor 42, an operating current flows in a semiconductor region overlapping an emitter electrode E0 in plan view, and consequently, heat is generated. In the semiconductor region of the transistor 42, a portion overlapping the emitter electrode E0 in plan view is a heat-generating source 48. With respect to the thickness direction of a semiconductor substrate 40, a region formed of a collector layer, a base layer, and an emitter layer of the transistor 42 is the heat-generating source 48. The heat generated in the heat-generating source 48 and flowing to the opposite side of the semiconductor substrate 40 is transferred to the land 21 of the printed circuit board 20 through a thermal path T0 formed by the emitter electrode E0, emitter wiring lines E1 and E2, and the bump 31.

Furthermore, part of the heat generated in the heat-generating source 48 diffuses inside the semiconductor substrate 40. The heat diffused inside the semiconductor substrate 40 is transferred to the land 21 of the printed circuit board 20 through a thermal path T1 formed by the semiconductor substrate 40, a heat-conductive member 51, a heat-conductive film 43, the second-layer emitter wiring line E2, and the bump 31.

The heat transferred to the land 21 of the printed circuit board 20 is transferred to the electrode 23 for external connection through the via conductors 24 and the wiring lines 25. The electrode 23 is connected to a large ground conductor such as a motherboard. Accordingly, the heat transferred to the electrode 23 is dissipated toward the external ground conductor having a thermal capacity sufficiently higher than the semiconductor chip 30.

In the first embodiment, heat that is generated in the heat-generating source 48 and that diffuses in the semiconductor substrate 40 in the lateral direction (the direction orthogonal to the thickness direction) is transferred to the heat-conductive member 51 covering the side surface of the through via-hole 41 and subsequently transferred to the heat-conductive film 43. Heat that is generated in the heat-generating source 48 and that diffuses in the semiconductor substrate 40 in the thickness direction is transferred to the heat-conductive member 51 covering a surface of the semiconductor substrate 40, the surface being opposite the mounting surface, and subsequently transferred to the heat-conductive film 43 through the heat-conductive member 51. Since a material having a thermal conductivity higher than the semiconductor substrate 40 is used as the heat-conductive member 51, the thermal resistance of the thermal path T1 can be reduced compared with the configuration in which the heat-conductive member 51 is not disposed.

In the first embodiment, heat diffusing in the semiconductor substrate 40 is dissipated to the outside through the thermal path T1 in addition to the thermal path T0. Accordingly, an increase in the temperature of the transistor 42 can be suppressed. Since the heat-conductive member 51 and the heat-conductive film 43 are in direct contact with each other without an insulating material or a semiconductor material therebetween, an increase in the thermal resistance of the thermal path T1 is suppressed. Therefore, heat can be efficiently dissipated through the thermal path T1.

The through via-hole 41 and the heat-conductive film 43 are preferably disposed so as to at least partially overlap the opening formed in the insulating film 46 and the bump 31 in plan view in order to reduce the thermal resistance of the thermal path T1. Furthermore, the land 21 for grounding of the printed circuit board 20 is preferably disposed so as to at least partially overlap the electrode 23 for grounding in plan view. Herein, the expression "at least partially overlap" means any of a state in which a part of one member overlaps a part of the other member in plan view, a state in which the entire region of one member overlaps a part of the other member in plan view, and a state in which the entire region of one member overlaps the entire region of the other member in plan view. A bump for grounding, the bump having a larger area than other bumps, is preferably used as the bump 31 that forms a part of the thermal path T1.

Next, modifications of the first embodiment will be described.

In the first embodiment, a substrate made of, for example, GaAs is used as the semiconductor substrate 40. Alternatively, a substrate made of another semiconductor may be used. Alternatively, an insulating substrate on which semiconductor regions of active elements can be epitaxially grown may be used. In the first embodiment, heterojunction bipolar transistors are used as the transistors 42. Alternatively, other active elements such as MIS transistors, MES transistors, and high electron mobility transistors (HEMT) may be used. In the first embodiment, Cu pillar bumps are used as the bumps 31. Alternatively, bumps having other structures may be used.

Second Embodiment

Next, a semiconductor device according to a second embodiment will be described with reference to FIG. 4. Hereinafter, descriptions of configurations that are common to those of the semiconductor device according to the first embodiment (FIG. 1A to FIG. 2B) will be omitted.

Figure 4:
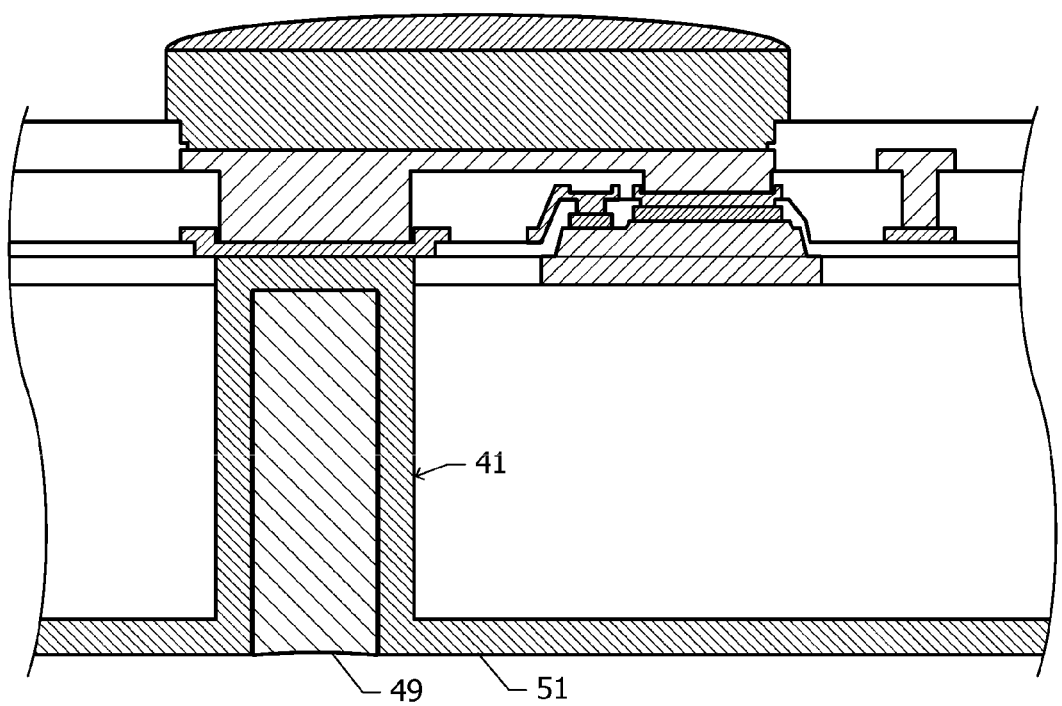
FIG. 4 is a sectional view of a semiconductor chip included in a semiconductor device according to a second embodiment.

FIG. 4 is a sectional view of a semiconductor chip included in a semiconductor device according to the second embodiment. In the first embodiment, the side surface and the bottom surface of the through via-hole 41 (FIG. 2B) are covered with the heat-conductive member 51, and the remaining portion in the through via-hole 41 is hollow or filled with a sealing resin (FIG. 1C). In the second embodiment, a heat-conductive paste 49 is embedded in a remaining portion of a through via-hole 41. Herein, the term "embedded" does not mean that a space in the through via-hole 41 is completely filled with the heat-conductive paste 49. For example, even in the case where a surface of the heat-conductive paste 49 is slightly depressed, this state can also be referred to as "embedded".

The thermal conductivity of the heat-conductive paste 49 is higher than the thermal conductivity of the sealing resin 28. A paste obtained by dispersing a metal powder or a ceramic powder in a paste-like substance can be used as the heat-conductive paste 49. For example, a resin such as an epoxy resin can be used as the paste-like substance. For example, a powder of silver, SiC, or MN can be used as the metal or ceramic powder. In general, the term "paste" refers to a substance having fluidity and a high viscosity. However, in this specification, a paste cured by heating or the like is also referred to as a "paste".

Next, advantageous effects of the second embodiment will be described. In the second embodiment, the heat-conductive paste 49 in the through via-hole 41 functions as a part of the thermal path T1 (FIG. 3). Therefore, the sectional area of the thermal path T1 is increased to decrease the thermal resistance. As a result, the efficiency of heat conduction through the thermal path T1 can be enhanced.

The heat-conductive paste 49 has a lower Young's modulus than the semiconductor substrate 40 even after being cured. The heat-conductive paste 49 is flexibly deformed in accordance with thermal deformation of the semiconductor substrate 40. This configuration provides an advantageous effect that even if the semiconductor substrate 40 is thermally deformed, the semiconductor chip 30 is less likely to be damaged compared with a configuration in which the through via-hole 41 is filled with a metal member.

Third Embodiment

Next, a semiconductor device according to a third embodiment will be described with reference to FIGS. 5A and 5B. Hereinafter, descriptions of configurations that are common to those of the semiconductor device according to the first embodiment (FIG. 1A to FIG. 2B) will be omitted.

Figure 5A:
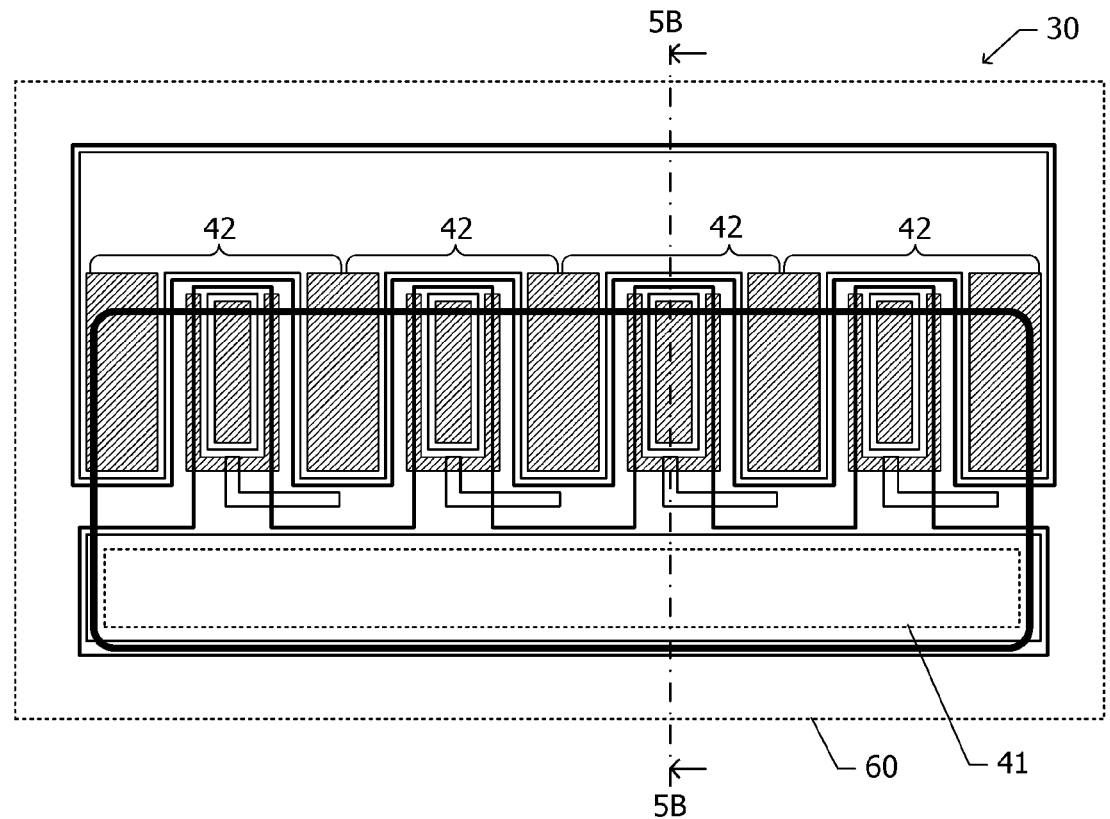
FIG. 5A is a plan view of an output-stage amplifier circuit formed on a semiconductor chip included in a semiconductor device according to a third embodiment.
Figure 5B:
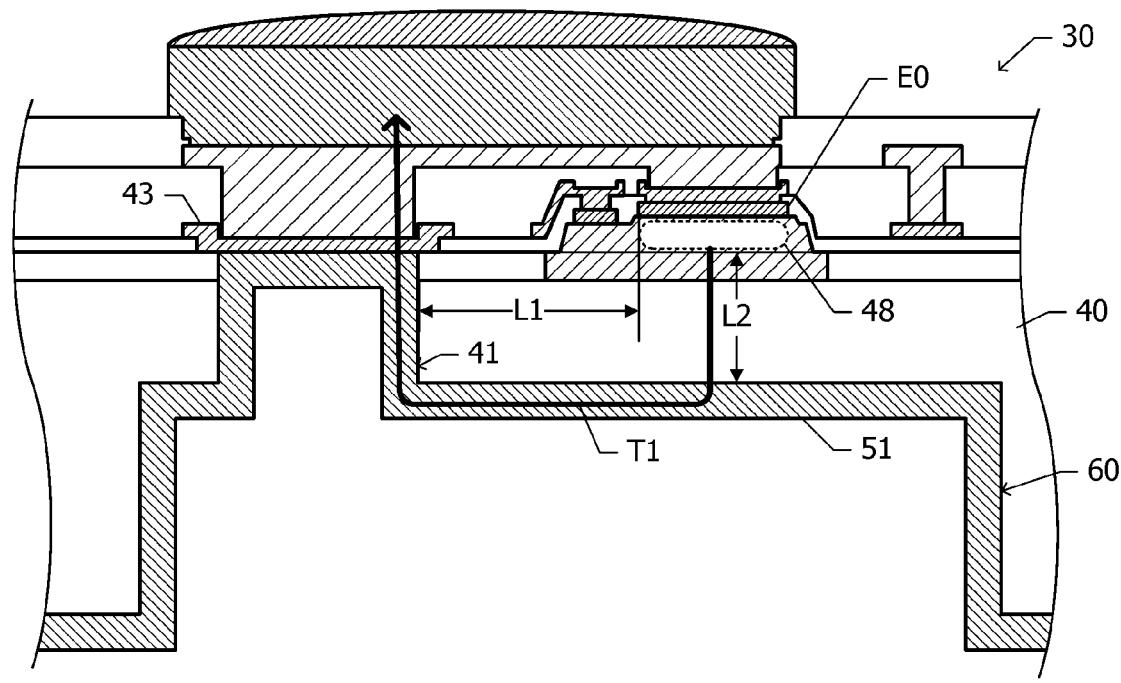
FIG. 5B is a sectional view taken along dash-dotted line 5B-5B in FIG. 5A.

FIG. 5A is a plan view of an output-stage amplifier circuit 13 (FIG. 1A) formed on a semiconductor chip 30 included in a semiconductor device according to the third embodiment. FIG. 5B is a sectional view taken along dash-dotted line 5B-5B in FIG. 5A. In the third embodiment, a recess 60 is formed in the bottom surface of a semiconductor substrate 40. The recess 60 does not reach the upper surface of the semiconductor substrate 40. In plan view, the recess 60 at least partially overlaps transistors 42, and a through via-hole 41 is formed in the region of the recess 60. FIG. 5A illustrates an example in which the transistors 42 are disposed inside the recess 60 in plan view. The through via-hole 41 extends from the bottom surface of the recess 60 to a heat-conductive film 43. The lower surface of the semiconductor substrate 40, the side surface and the bottom surface of the recess 60, and the side surface and the bottom surface of the through via-hole 41 are covered with a heat-conductive member 51.

Next, advantageous effects of the third embodiment will be described. In the third embodiment, since the recess 60 is formed in the semiconductor substrate 40, the distance from a heat-generating source 48 to the heat-conductive member 51 with respect to the thickness direction of the semiconductor substrate 40 is shorter than that in the first embodiment. The reduction in the length of the thermal path T1 decreases the thermal resistance. Thus, the efficiency of heat conduction through the thermal path T1 can be enhanced. A reduction in the thickness of the semiconductor substrate 40 may decrease mechanical strength of the semiconductor chip 30. However, the thickness of the semiconductor substrate 40 is not reduced in regions other than the region functioning as the thermal path T1 in the third embodiment. Therefore, sufficient mechanical strength of the semiconductor chip 30 can be maintained.

The thermal conductivity of the heat-conductive member 51 can be considered to be sufficiently higher than the thermal conductivity of the semiconductor substrate 40. In this case, a distance L2 from the heat-generating source 48 to the bottom surface of the recess 60 is preferably shorter than a distance L1 from the heat-generating source 48 to the through via-hole 41 in the lateral direction in order to obtain a sufficient effect achieved by decreasing the thermal resistance of the thermal path T1. An end portion of an emitter electrode E0 is preferably defined as the starting point of the distance L1 from the heat-generating source 48 to the through via-hole 41. The lower surface of a collector layer that forms a transistor 42 is preferably defined as the starting point of the distance L2 from the heat-generating source 48 to the bottom surface of the recess 60.

Fourth Embodiment

Next, a semiconductor device according to a fourth embodiment will be described with reference to FIG. 6. Hereinafter, descriptions of configurations that are common to those of the semiconductor device according to the third embodiment (FIGS. 5A and 5B) will be omitted.

Figure 6:
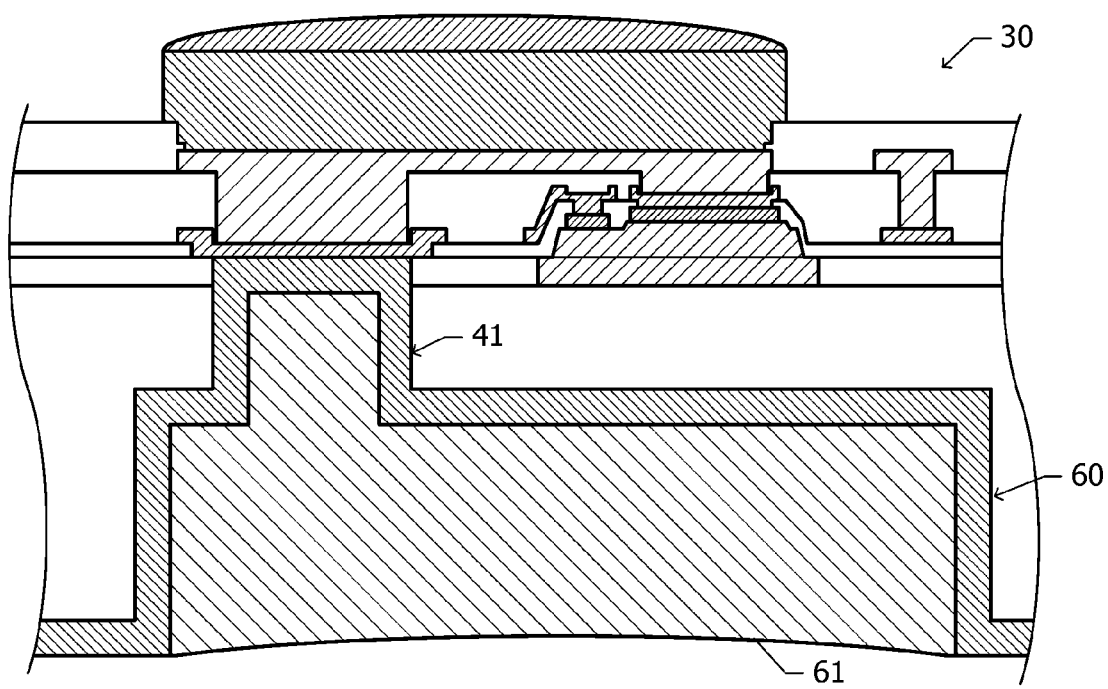
FIG. 6 is a sectional view of a semiconductor chip included in a semiconductor device according to a fourth embodiment.

FIG. 6 is a sectional view of a semiconductor chip 30 included in a semiconductor device according to the fourth embodiment. In the fourth embodiment, a heat-conductive paste 61 is embedded in a recess 60 and a through via-hole 41. For example, a heat-conductive paste that is the same as the heat-conductive paste 49 (FIG. 4) used in the semiconductor device according to the second embodiment is preferably used as the heat-conductive paste 61.

Next, advantageous effects of the fourth embodiment will be described. In the fourth embodiment, since the heat-conductive paste 61 is embedded in the recess 60 and the through via-hole 41, the efficiency of heat conduction can be enhanced as in the second embodiment. As a result, an increase in the temperature of a transistor 42 can be suppressed.

The heat-conductive paste 61 has a lower Young's modulus than a semiconductor substrate 40 even after being cured. The heat-conductive paste 61 is flexibly deformed in accordance with thermal deformation of the semiconductor substrate 40. This configuration provides an advantageous effect that even if the semiconductor substrate 40 is thermally deformed, the semiconductor chip 30 is less likely to be damaged compared with a configuration in which the through via-hole 41 and the recess 60 are filled with a metal member.

Furthermore, the heat-conductive paste 61 embedded in the recess 60 can compensate for a decrease in mechanical strength of a portion of the semiconductor substrate 40, the portion having a reduced thickness due to the formation of the recess 60. With this configuration, it is possible to suppress damage of the semiconductor chip, the damage being caused by application of mechanical stress in a processing step such as chip dicing.

Fifth Embodiment

Next, a semiconductor device according to a fifth embodiment will be described with reference to FIGS. 7A and 7B. Hereinafter, descriptions of configurations that are common to those of the semiconductor device according to the first embodiment (FIG. 1A to FIG. 2B) will be omitted.

Figure 7A:
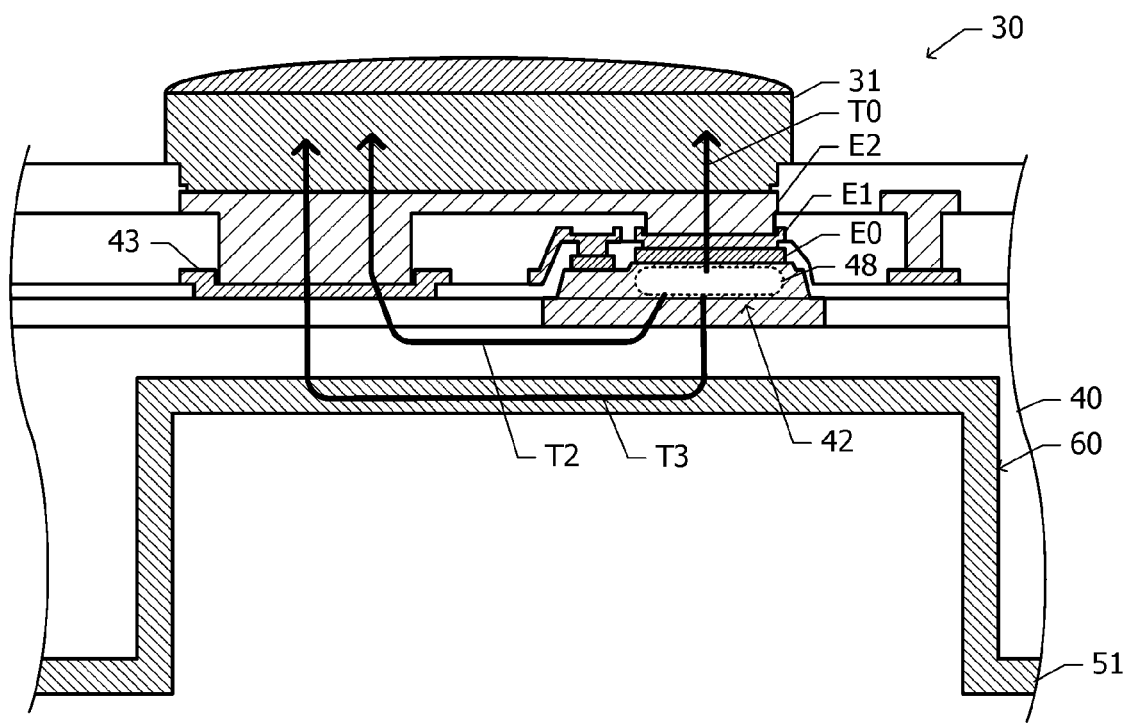
FIG. 7A is a sectional view of a semiconductor chip included in a semiconductor device according to a fifth embodiment.

FIG. 7A is a sectional view of a semiconductor chip 30 included in a semiconductor device according to the fifth embodiment. In the first embodiment, the semiconductor substrate 40 has the through via-hole 41 extending from the lower surface thereof to the heat-conductive film 43 (FIG. 2B) on the upper surface thereof. In the fifth embodiment, a semiconductor substrate 40 does not have a through via-hole but has, on the lower surface thereof, a recess 60 that does not reach the upper surface thereof. The side surface and the bottom surface of the recess 60 are covered with a heat-conductive member 51. The recess 60 at least partially overlaps an emitter electrode E0 of a transistor 42 and a heat-conductive film 43 in plan view. The heat-conductive member 51 disposed on the bottom surface of the recess 60 and the heat-conductive film 43 face each other with a part of the semiconductor substrate 40 therebetween and are not in contact with each other. A sealing resin 28 (FIG. 1C) is embedded in the recess 60.

Figure 7B:
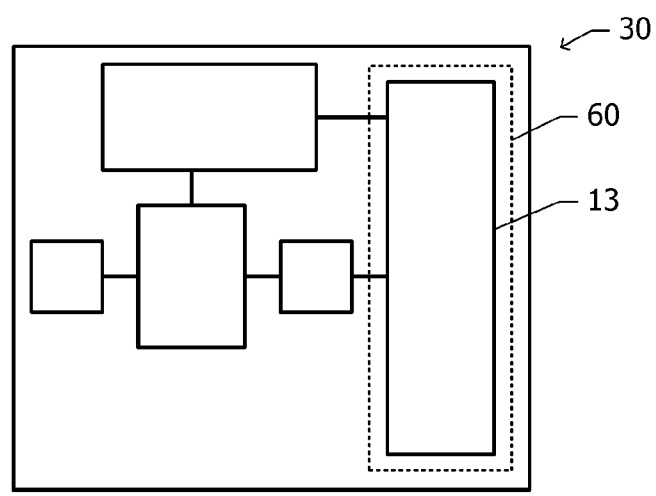
FIG. 7B is a plan view illustrating a layout of circuits of a semiconductor device according to the fifth embodiment.

FIG. 7B is a plan view illustrating a layout of circuits of a semiconductor device according to the fifth embodiment. In the first embodiment, the through via-hole 41 (FIG. 1B) is disposed in a region where the output-stage amplifier circuit 13 is disposed. In the fifth embodiment, the recess 60 is disposed so as to include an output-stage amplifier circuit 13 inside thereof.

Next, advantageous effects of the fifth embodiment will be described. In the fifth embodiment, a thermal path T0 extending from a heat-generating source 48 to a bump 31 through the emitter electrode E0 and emitter wiring lines E1 and E2 is formed as in the thermal path T0 (FIG. 3) of the first embodiment. In addition, a thermal path T2 is formed in which heat is transferred from the heat-generating source 48 in the semiconductor substrate 40 in the lateral direction to the bump 31 through the heat-conductive film 43 and the second-layer emitter wiring line E2. Furthermore, a thermal path T3 is formed in which heat generated in the heat-generating source 48 diffuses in the semiconductor substrate 40 in the thickness direction, is transferred in the heat-conductive member 51 in the lateral direction, is subsequently transferred in the semiconductor substrate 40 in the thickness direction, and reaches the bump 31.

The thermal conductivity of the heat-conductive member 51 that forms a part of the thermal path T3 is higher than the thermal conductivity of the semiconductor substrate 40. The formation of the recess 60 reduces the length of a portion of the thermal path T3, the portion being formed by the semiconductor substrate 40, which has a low thermal conductivity. Accordingly, thermal resistance of the thermal path T3 is decreased, and the efficiency of heat conduction through the thermal path T3 can be enhanced.

If the thickness of the entire semiconductor substrate 40 is reduced, it is difficult to ensure sufficient mechanical strength. In the fifth embodiment, the thickness of the semiconductor substrate 40 is not reduced in regions other than the region functioning as the thermal path T3. Therefore, sufficient mechanical strength of the semiconductor chip 30 can be maintained.

Sixth Embodiment

Next, a semiconductor device according to a sixth embodiment will be described with reference to FIG. 8. Hereinafter, descriptions of configurations that are common to those of the semiconductor device according to the fifth embodiment (FIGS. 7A and 7B) will be omitted.

Figure 8:
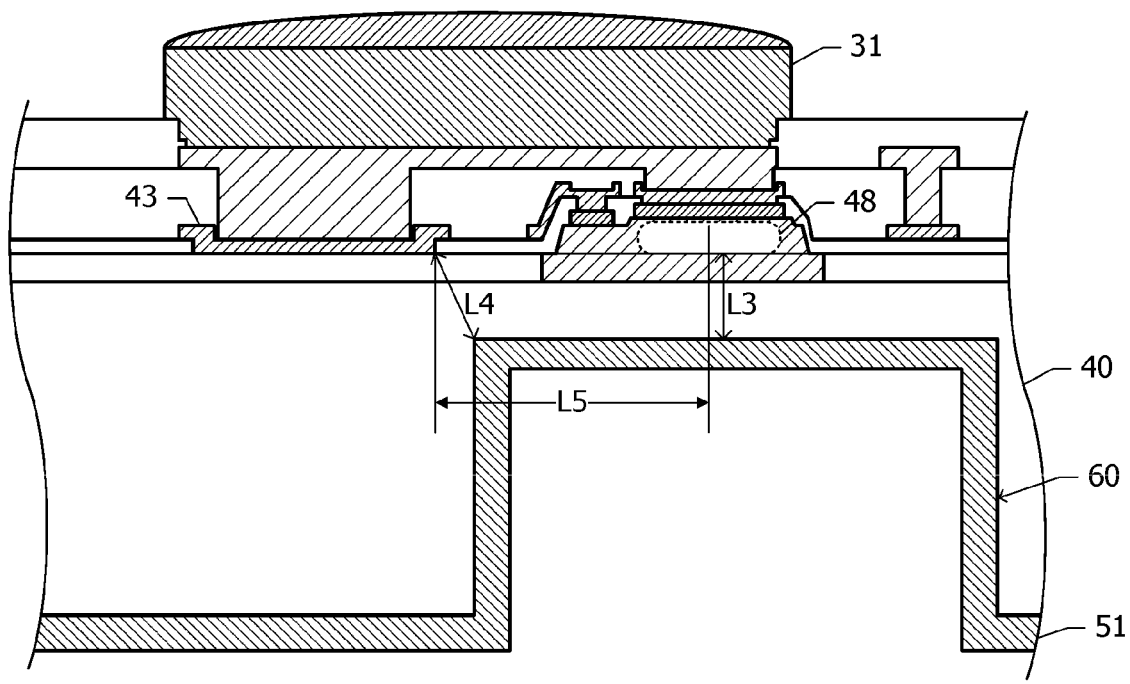
FIG. 8 is a sectional view of a semiconductor chip included in a semiconductor device according to a sixth embodiment.

FIG. 8 is a sectional view of a semiconductor chip 30 included in a semiconductor device according to the sixth embodiment. In the fifth embodiment, the recess 60 (FIG. 7A) at least partially overlaps both the heat-generating source 48 and the heat-conductive film 43 in plan view. In the sixth embodiment, a recess 60 does not necessarily overlap both a heat-generating source 48 and a heat-conductive film 43. FIG. 8 illustrates an example in which the recess 60 overlaps the heat-generating source 48 but does not overlap the heat-conductive film 43 in plan view. The recess 60 is disposed so as to partially overlap a region located between the heat-generating source 48 and the heat-conductive film 43 in plan view.

In the sixth embodiment, a heat-conductive member 51 forms a part of a thermal path through which heat that is generated in the heat-generating source 48 and that diffuses in a semiconductor substrate 40 is transferred to a bump 31.

Next, a preferred relative positional relationship of the recess 60, the heat-generating source 48, and the heat-conductive film 43 will be described. The shortest distance from the heat-generating source 48 to the heat-conductive member 51 disposed on the bottom surface of the recess 60 is denoted by L3. The shortest distance from the heat-conductive film 43 to the heat-conductive member 51 is denoted by L4. The shortest distance from a position of the geometric center of the heat-generating source 48 to the heat-conductive film 43 in plan view is denoted by L5. The thermal conductivity of the heat-conductive member 51 can be considered to be sufficiently higher than the thermal conductivity of the semiconductor substrate 40. In this case, the position and the depth of the recess 60 are preferably determined such that L3+L4 is equal to or less than L5 in order to obtain a sufficient effect achieved by forming the recess 60 and disposing the heat-conductive member 51 on surfaces of the recess 60.

Seventh Embodiment

Next, a semiconductor device according to a seventh embodiment will be described with reference to FIG. 9. Hereinafter, descriptions of configurations that are common to those of the semiconductor device according to the fifth embodiment (FIGS. 7A and 7B) will be omitted.

Figure 9:
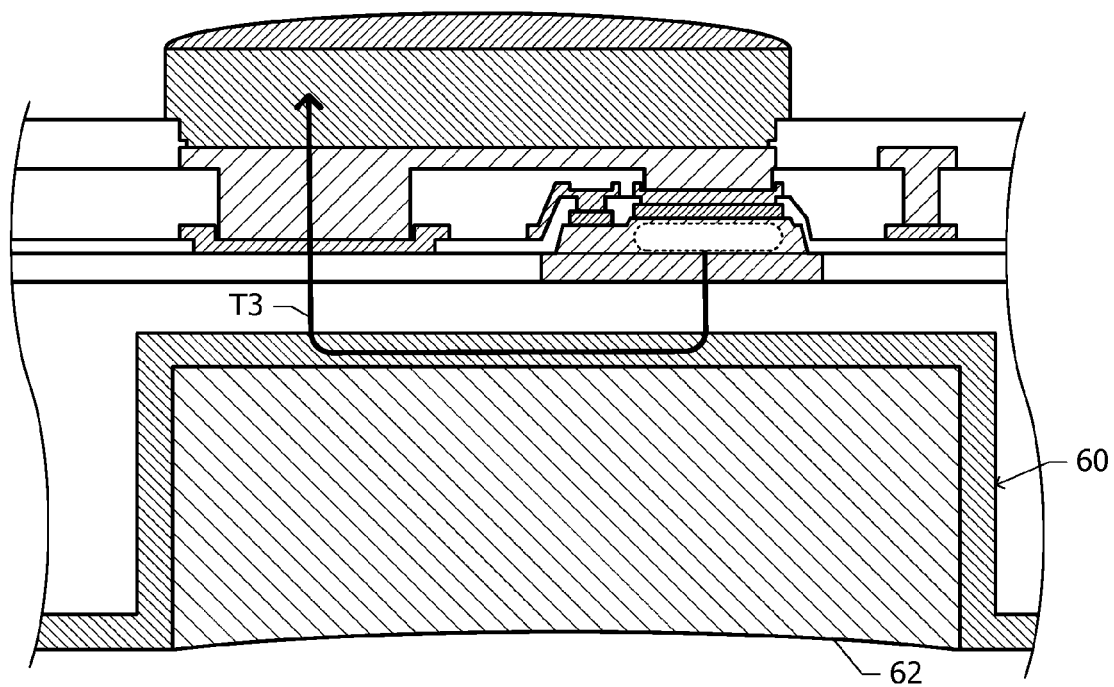
FIG. 9 is a sectional view of a semiconductor chip included in a semiconductor device according to a seventh embodiment.

FIG. 9 is a sectional view of a semiconductor chip 30 included in a semiconductor device according to the seventh embodiment. In the fifth embodiment, after the semiconductor chip 30 is mounted on a printed circuit board 20 (FIG. 1C), a sealing resin 28 (FIG. 1C) is embedded in the recess 60. In the seventh embodiment, a heat-conductive paste 62 is embedded in a recess 60. For example, a heat-conductive paste that is the same as the heat-conductive paste 49 (FIG. 4) used in the semiconductor device according to the second embodiment can be used as the heat-conductive paste 62.

Next, advantageous effects of the seventh embodiment will be described. In the seventh embodiment, the heat-conductive paste 62 has a function of increasing a sectional area of a portion of a thermal path T3, the portion extending in a heat-conductive member 51 in the lateral direction. Therefore, the thermal resistance of the thermal path T3 decreases, and the efficiency of heat conduction through the thermal path T3 can be enhanced. As a result, an increase in the temperature of a transistor 42 can be suppressed.

Furthermore, the heat-conductive paste 62 embedded in the recess 60 can compensate for a decrease in mechanical strength of a portion of the semiconductor substrate 40, the portion having a reduced thickness due to the formation of the recess 60. With this configuration, it is possible to suppress damage of the semiconductor substrate 40, the damage being caused by application of mechanical stress in a processing step such as chip dicing.

The embodiments described above are exemplary, and, needless to say, a partial replacement or combination of configurations described in different embodiments is possible. The same or similar operations and effects achieved by the same or similar configurations in a plurality of embodiments will not be mentioned in each of the embodiments. Furthermore, the present disclosure is not limited to the embodiments described above. For example, it is obvious for those skilled in the art that various modifications, improvements, combinations, and the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
   a printed circuit board having a land on a mounting surface and a land on a bottom surface of the printed circuit board, wherein the land on the mounting surface and the land on the bottom surface are connected to each other with a via-hole or a plurality of via-holes in the printed circuit board; and
   a semiconductor chip mounted on the printed circuit board, the semiconductor chip being sealed with a sealing resin,
   wherein the semiconductor chip includes
      an active element on or in a substrate, the active element facing a first surface of the substrate, the first surface facing the printed circuit board, wherein the active element has at least an electrode that is in contact with the active element at the first surface of the substrate,
      a heat-conductive film that is disposed on the first surface of the substrate at a position different from a position of the active element and that is made of a material having a higher thermal conductivity than the substrate,
an insulating film that is disposed on the first surface of the substrate and that covers the active element and the heat-conductive film,
a bump that is disposed on the insulating film, and that is electrically connected to the heat-conductive film and the electrode that is in contact with the active element at the first surface of the substrate, and is connected to the land on the mounting surface,
a through via-hole extending from a second surface opposite the first surface of the substrate to the heat-conductive film,
a heat-conductive member that is continuously disposed from a region of the second surface, the region overlapping the active element in plan view, to an inner surface of the through via-hole and that is made of a material having a higher thermal conductivity than the substrate, and
wherein the heat-conductive member is electrically connected to the electrode that is in contact with the active element at the first surface of the substrate through the bump and the land on the mounting surface.

2. The semiconductor device according to claim 1, wherein the bump and the heat-conductive film at least partially overlap in plan view.

3. The semiconductor device according to claim 2, wherein
the semiconductor chip further includes a recess formed in the second surface of the substrate,
the recess at least partially overlaps the active element in plan view,
the through via-hole is formed in a region of the recess, and
the heat-conductive member is disposed on an inner surface of the recess.

4. The semiconductor device according to claim 3, wherein
the heat-conductive member covers the inner surface of the through via-hole, and
the semiconductor chip further includes a heat-conductive paste embedded in the through via-hole.

5. The semiconductor device according to claim 3, wherein
the heat-conductive member covers the inner surfaces of the recess and the through via-hole, and
the semiconductor chip further includes a heat-conductive paste embedded in the through via-hole and in the recess.

6. The semiconductor device according to claim 2, wherein
the heat-conductive member covers the inner surface of the through via-hole, and
the semiconductor chip further includes a heat-conductive paste embedded in the through via-hole.

7. The semiconductor device according to claim 1, wherein
the semiconductor chip further includes a recess formed in the second surface of the substrate,
the recess at least partially overlaps the active element in plan view,
the through via-hole is formed in a region of the recess, and
the heat-conductive member is disposed on an inner surface of the recess.

8. The semiconductor device according to claim 7, wherein
the heat-conductive member covers the inner surfaces of the recess and the through via-hole, and
the semiconductor chip further includes a heat-conductive paste embedded in the through via-hole and in the recess.

9. The semiconductor device according to claim 7, wherein
the heat-conductive member covers the inner surface of the through via-hole, and
the semiconductor chip further includes a heat-conductive paste embedded in the through via-hole.

10. The semiconductor device according to claim 1, wherein
the heat-conductive member covers the inner surface of the through via-hole, and
the semiconductor chip further includes a heat-conductive paste embedded in the through via-hole.

11. The semiconductor device according to claim 1, including emitter wiring, the emitter wiring positioned to extend from the active element to the heat conductive film.

12. The semiconductor device according to claim 1, wherein the electrode that is in contact with the active element at the first surface of the substrate is connected to the land on the mounting surface for grounding.

13. A semiconductor device comprising:
a printed circuit board having a land on a mounting surface and a land on a bottom surface of the printed circuit board; and
a semiconductor chip mounted on the printed circuit board, the semiconductor chip being sealed with a sealing resin,
wherein the land on the mounting surface and the land on the bottom surface are connected to each other with a via-hole or a plurality of via-holes in the printed circuit board,
wherein the semiconductor chip includes
an active element on or in a substrate, the active element facing a first surface of the substrate, the first surface facing the printed circuit board, wherein the active element has at least an electrode that is in contact with the active element at the first surface of the substrate;
a heat-conductive film that is disposed on the first surface of the substrate at a position different from a position of the active element and that is made of a material having a higher thermal conductivity than the substrate;
an insulating film that is disposed on the first surface of the substrate and that covers the active element and the heat-conductive film;
a bump that is disposed on the insulating film, and that is electrically connected to the heat-conductive film and the electrode that is in contact with the active element at the first surface of the substrate, and is connected to the land on the mounting surface;
a recess that is formed in a second surface of the substrate, the second surface being opposite the first surface, and that at least partially overlaps the active element and the heat-conductive film in plan view; and
a heat-conductive member that is disposed on an inner surface of the recess and that is made of a material having a higher thermal conductivity than the substrate, wherein the heat-conductive member disposed on a bottom surface of the recess and the heat-conductive film face each other with a part of the substrate therebetween, and wherein the heat-conductive member is electrically connected to the electrode that is in contact with the active element at the first surface of the substrate through the bump and the land on the mounting surface.

14. The semiconductor device according to claim 13, wherein the bump and the heat-conductive film at least partially overlap in plan view.

15. The semiconductor device according to claim 14, further comprising a heat-conductive paste embedded in the recess.

16. The semiconductor device according to claim 15, wherein a sum of a shortest distance from a heat-generating source of the active element to the heat-conductive member and a shortest distance from the heat-conductive film to the heat-conductive member is equal to or less than a distance from the heat-generating source to the heat-conductive film.

17. The semiconductor device according to claim 14, wherein a sum of a shortest distance from a heat-generating source of the active element to the heat-conductive member and a shortest distance from the heat-conductive film to the heat-conductive member is equal to or less than a distance from the heat-generating source to the heat-conductive film.

18. The semiconductor device according to claim 13, further comprising a heat-conductive paste embedded in the recess.

19. The semiconductor device according to claim 18, wherein a sum of a shortest distance from a heat-generating source of the active element to the heat-conductive member and a shortest distance from the heat-conductive film to the heat-conductive member is equal to or less than a distance from the heat-generating source to the heat-conductive film.

20. The semiconductor device according to claim 13, wherein a sum of a shortest distance from a heat-generating source of the active element to the heat-conductive member and a shortest distance from the heat-conductive film to the heat-conductive member is equal to or less than a distance from the heat-generating source to the heat-conductive film.

21. The semiconductor device according to claim 13, including emitter wiring, the emitter wiring positioned to extend from the active element to the heat conductive film.

22. The semiconductor device according to claim 13, wherein the electrode that is in contact with the active element at the first surface of the substrate is connected to the land on the mounting surface for grounding.

* * * * *